(12) United States Patent
Sasaki (10) Patent No.: US 10,336,034 B2
(45) Date of Patent: Jul. 2, 2019

(54) CARRIER-ATTACHED METAL FOIL

(75) Inventor: Beji Sasaki, Tokyo (JP)

(73) Assignee: FREESIA MACROSS CORPORATION, Tokyo (JP)

( * ) Notice: Subject to any disclaimer, the term of this patent is extended or adjusted under 35 U.S.C. 154(b) by 497 days.

(21) Appl. No.: 14/383,417

(22) PCT Filed: Aug. 31, 2012

(86) PCT No.: PCT/JP2012/072150
§ 371 (c)(1),
(2), (4) Date: Nov. 24, 2014

(87) PCT Pub. No.: WO2013/132680
PCT Pub. Date: Sep. 12, 2013

(65) Prior Publication Data
US 2015/0111000 A1    Apr. 23, 2015

(30) Foreign Application Priority Data

Mar. 6, 2012  (JP) .................... 2012-048847
Aug. 24, 2012 (JP) .................... 2012-185397

(51) Int. Cl.
*B32B 3/02* (2006.01)
*B32B 3/06* (2006.01)
(Continued)

(52) U.S. Cl.
CPC .............. *B32B 7/12* (2013.01); *B32B 3/06* (2013.01); *B32B 7/04* (2013.01); *B32B 7/06* (2013.01);
(Continued)

(58) Field of Classification Search
CPC .... B32B 3/02; B32B 3/06; B32B 7/04; B32B 7/045; B32B 7/12; B32B 15/04; B32B 15/08; B32B 15/20; Y10T 428/24025; Y10T 428/24479; Y10T 428/24488; Y10T 428/24521; Y10T 428/24612;
(Continued)

(56) References Cited

U.S. PATENT DOCUMENTS 5,015,318 A * 5/1991 Smits ................. B65D 55/026
                                                      156/233
5,360,652 A * 11/1994 Kobayashi ......... G11B 7/24024
                                                      346/135.1

(Continued)

FOREIGN PATENT DOCUMENTS

EP     0395871 A2    11/1990
EP     2361762 A1     8/2011
(Continued)

OTHER PUBLICATIONS

Extended European search report dated Dec. 1, 2015 in the counterpart European patent application.
Taiwanese office action letter dated Mar. 22, 2016 in the counterpart Japanese patent application.
Office action dated Aug. 31, 2018 in a counterpart European patent application.

*Primary Examiner* — Megha M Gaitonde
(74) *Attorney, Agent, or Firm* — Metrolexis Law Group, PLLC (57) ABSTRACT

A carrier-attached metal foil includes a plate-shaped carrier, a metal foil laminated on at least one of surfaces of the carrier, and a fixing unit configured to fix a periphery of the carrier and a periphery of the metal foil to each other.

9 Claims, 8 Drawing Sheets

(51) Int. Cl.
*B32B 3/10* (2006.01)
*B32B 3/18* (2006.01)
*B32B 7/12* (2006.01)
*B32B 7/04* (2019.01)
*B32B 15/04* (2006.01)
*H05K 3/02* (2006.01)
*B32B 7/06* (2019.01)
*B32B 7/14* (2006.01)
*B32B 15/14* (2006.01)
*B32B 15/20* (2006.01)
*H05K 3/46* (2006.01)

(52) U.S. Cl.
CPC ............... *B32B 7/14* (2013.01); *B32B 15/04* (2013.01); *B32B 15/14* (2013.01); *B32B 15/20* (2013.01); *H05K 3/022* (2013.01); *B32B 2250/02* (2013.01); *B32B 2250/40* (2013.01); *B32B 2255/06* (2013.01); *B32B 2255/26* (2013.01); *B32B 2260/021* (2013.01); *B32B 2260/046* (2013.01); *B32B 2262/106* (2013.01); *B32B 2457/00* (2013.01); *H05K 3/4652* (2013.01); *H05K 2201/068* (2013.01); *Y10T 428/239* (2015.01); *Y10T 428/24488* (2015.01); *Y10T 428/24777* (2015.01); *Y10T 428/24917* (2015.01); *Y10T 428/31678* (2015.04)

(58) Field of Classification Search
CPC ........ Y10T 428/24942; Y10T 428/2495; C09J 129/04; C09J 2429/003; C09J 2429/008; H05K 3/022
USPC ....... 428/101, 156, 157, 159, 161, 164, 172, 428/212, 213
See application file for complete search history.

(56) References Cited

U.S. PATENT DOCUMENTS

| | | | | |
|---|---|---|---|---|
| 6,337,471 | B1* | 1/2002 | Kistner | B21D 26/055 219/633 |
| 6,445,676 | B1* | 9/2002 | Fujii | G11B 7/24024 369/281 |
| 6,652,962 | B1* | 11/2003 | Sato | B32B 15/08 106/38.22 |
| 6,887,334 | B2* | 5/2005 | Cherpinsky | B32B 27/08 156/238 |
| 2003/0017357 | A1 | 1/2003 | Steiner et al. | |
| 2004/0101696 | A1* | 5/2004 | Yamazaki | B32B 15/08 428/457 |
| 2004/0112516 | A1 | 6/2004 | Wilheim et al. | |
| 2007/0119364 | A1* | 5/2007 | Taylor | G01K 1/02 116/216 |
| 2007/0268675 | A1 | 11/2007 | Chinda et al. | |
| 2011/0262722 | A1 | 10/2011 | Takamori | |

FOREIGN PATENT DOCUMENTS

| | | |
|---|---|---|
| JP | 2004-273531 A | 9/2004 |
| JP | 2005-142318 A | 6/2005 |
| JP | 2007-311688 A | 11/2007 |
| JP | 2008-270697 A | 11/2008 |
| JP | 2009-143233 A | 7/2009 |
| JP | 2009-143234 A | 7/2009 |
| JP | 2009-272589 A | 11/2009 |
| JP | 2010-050351 A | 3/2010 |
| JP | 4579347 B1 | 11/2010 |
| JP | 2011-235537 A | 11/2011 |
| TW | 200725823 A | 7/2007 |
| TW | 201126679 A | 8/2011 |

\* cited by examiner

RELATED ART

RELATED ART

RELATED ART

CARRIER-ATTACHED METAL FOIL

TECHNICAL FIELD

The present invention relates to a carrier-attached metal foil used for manufacturing a laminated board (a coreless board or an all-layer build-up board).

BACKGROUND ART

Related Example I

Requests for reductions in weight, profile, length and size of electronic devices and the like in recent years show no sign of slowing down, and printed wiring boards constituting basic components of the electronic devices and the like are facing strong demands for an increase in the number of layers, higher density of metal foil circuits therein, and thin profiling of the board thickness to the utmost limit.

According to a related board proposed in Patent Literature 1, a multi-layer structure is formed by repeating a process (a build-up process) including: laminating a prepreg (glass cloth impregnated with epoxy resin and semi-cured) and a copper foil on a copper clad laminate board called CCL; and performing circuit formation and the like thereon.

However, there is also a demand for a reduction in thickness of the CCL associated with the reduction in thickness of the laminated board. An ultra-thin CCL in the thickness of about 20 μm has been developed in recent years, and is being gradually adopted in a mass production process for ultra-thin boards.

The CCL has a function as a surface plate (a support for retaining flatness) for forming the multi-layer structure. However, the CCL no longer functions as the support for retaining flatness due to its reduction in thickness. This is causing various problems in the mass production process.

Related Example II

There is an attempt to use a metal plate such as a SUS (stainless used steel) intermediate plate as the surface plate. Specifically, there is a coreless board prepared by attaching a copper foil onto the metal plate using a pressure-sensitive adhesive and forming a build-up layer thereon.

As shown in FIGS. 1(a) to 1(d), 2(a) to 2(c), and 3(a) to 3(d), copper foils 103 are first laminated on two sides of a metal (SUS) base member 101 using pressure-sensitive adhesives 104. Next, prepregs (PP) 102 and more copper foils 103 are laminated, and then outline machining, via-hole formation, and circuit formation are conducted (the build-up process). The coreless boards of the all-layer build-up structure are manufactured by repeating these steps (although it is not illustrated, the outline machining is conducted for each laminated layer). In this process, the SUS intermediate plate is used as a carrier of the coreless boards. The coreless boards are formed on the front and back of this carrier, respectively. Accordingly, this process has an advantage of higher productivity since two boards can be processed in one plating step, for example.

CITATION LIST

Patent Literature

PTL 1: Japanese Unexamined Patent Application Publication No. 2009-272589

SUMMARY OF INVENTION

However, when the ultra-thin CCL is used like in Related Example I described above, the CCL cannot be passed through an ordinary etching line since the CCL is the material that is as thin as paper.

In particular, when the ultra-thin board is conveyed with rollers, the CCL is likely to bend due to its own weight and falls between the rollers, and is thus prone to cause wrinkles and folds during lamination work, thereby leading to a problem of deterioration in yield.

In the meantime, the ultra-thin CCL involves internal strain. To be more precise, at the time of manufacturing the CCL, the prepregs are polymerized, and thereby transition to a C-stage (final-stage curing) and then get cured and stabilized. In this case, the prepregs involve cure shrinkage.

The CCL involves this shrinkage strain. Here, no warpage or shrinkage occurs in a three-layer structure of the CCL due to a symmetric effect (a situation in which the copper foils support from two sides). However, if the CCL is subjected to removal by etching, a removed portion incurs warpage and shrinkage, which make alignment (positioning of a pattern) work at the time of patterning and scaling work (setting a magnification on a mask film) infeasible in subsequent steps.

For example, the ultra-thin CCL with one side entirely subjected to removal by etching releases the shrinkage strain attributed to the prepreg and is therefore deformed into a tubular shape, which complicates machining in the next step.

Moreover, in the process using the metal plate like in Related Example II, a metal component melts and flows out during the etching at the time of the circuit formation or in the plating step. The metal component causes a problem of contamination of an etchant or a plating solution.

Furthermore, in the process using the metal plate, the weak pressure-sensitive adhesive layer is provided between the base member 101 and each copper foil 103, because the base member 101 needs to be easily peeled off after the coreless board 100 is manufactured.

In the process using the metal plate, an end portion of the metal plate is exposed in the outline machining step. Accordingly, an interface between the metal plate and the copper foil 103, having the weak pressure-sensitive adhesive structure, is prone to detachment. As a consequence, at the time of immersion in a chemical solution used at the time of the etching or plating work, the chemical solution leaks in from the weak pressure-sensitive adhesive interface between the metal plate and the copper foil 103 and adversely affects the subsequent steps.

On the other hand, it is preferable that the interface between the copper layer 103 and the metal plate be easily detachable at the time of separation in the final step. In other words, there is a trade-off relation between the situation where the interface desirably establishes the attachment as strongly as possible during the manufacturing process in order to avoid infiltration of the chemical solution and the situation where the interface needs to be easily peeled off at the time of separation.

In addition, while the pressure-sensitive adhesive 104 remains on the surface of the coreless board 100 after the separation, the pressure-sensitive adhesive 104 is generally water-insoluble and therefore needs to be removed by a physical polishing or chemical polishing step.

However, it is difficult to uniformly remove the pressure-sensitive adhesive 104 and to avoid adverse influences on the subsequent circuit formation step.

An object of the present invention is to provide a carrier-attached metal foil which can improve operability in manufacturing a laminated board.

An aspect of the present invention is a carrier-attached metal foil including: a plate-shaped carrier; a metal foil laminated on at least one of surfaces of the carrier; and a fixing unit configured to fix a periphery of the carrier and a periphery of the metal foil to each other.

The fixing unit may be a pressure-sensitive adhesive provided between the carrier and the metal foil and at the periphery of the carrier and the periphery of the metal foil.

Upon occurrence of a difference in expansion or contraction between the carrier and the metal foil due to a change in temperature, the pressure-sensitive adhesive may be configured to flow in accordance with the difference in expansion or contraction and keep holding the carrier and the metal foil while relaxing internal stresses of the carrier and the metal foil.

The pressure-sensitive adhesive may be provided between the carrier and the metal foil and on entire surfaces of the carrier and the metal foil, the pressure-sensitive adhesive may be active at the periphery of the carrier to form the fixing unit, and the pressure-sensitive adhesive may be inactive in a central region of the carrier other than the periphery of the carrier.

Upon occurrence of a difference in expansion or contraction between the carrier and the metal foil due to a change in temperature, the pressure-sensitive adhesive may be configured to flow in accordance with the difference in expansion or contraction and keeps holding the carrier and the metal foil while relaxing internal stresses of the carrier and the metal foil.

The carrier-attached metal foil may further include a void filler shaped in a plate with a thickness equal to a thickness of the pressure-sensitive adhesive, and provided between the carrier and the metal foil and at a location other than a location where the pressure-sensitive adhesive is provided.

Fine asperities may be formed in the periphery of the carrier, and the central region of the carrier may be formed into a mirror surface.

The carrier-attached metal foil may further include a recess provided at a region of the carrier where the pressure-sensitive adhesive is provided, the recess being formed by reducing a thickness of the carrier by a thickness of the pressure-sensitive adhesive.

The carrier-attached metal foil may be cut off on inside of the fixing unit fixing the carrier and the metal foil to each other.

The above-described configurations bring about an effect that it is possible to provide a carrier-attached metal foil which can improve operability in manufacturing a laminated board.

BRIEF DESCRIPTION OF DRAWINGS

FIGS. 4(a) to 4(c) are views showing a schematic configuration of a carrier-attached metal foil according to an embodiment of the present invention.

FIGS. 7(a) and 7(b) are explanatory views of the carrier-attached metal foil as a product or a half-finished product.

DESCRIPTION OF EMBODIMENTS

Figure 1A:
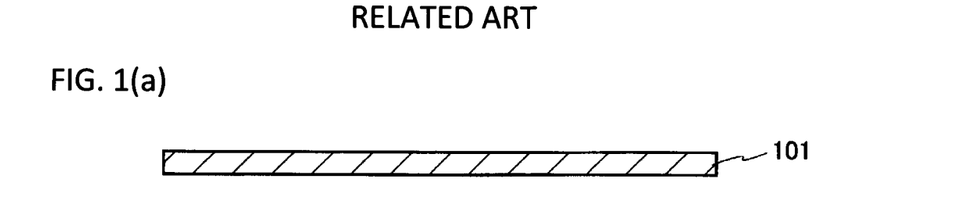
FIGS. 1(a) to 1(d) are views showing a method of manufacturing a related coreless board.
Figure 1B:
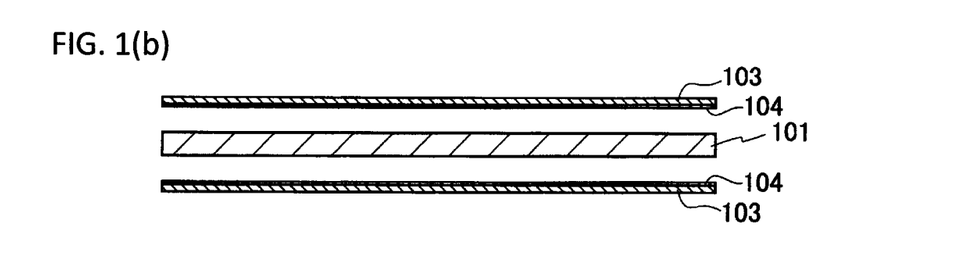
Figure 1C:
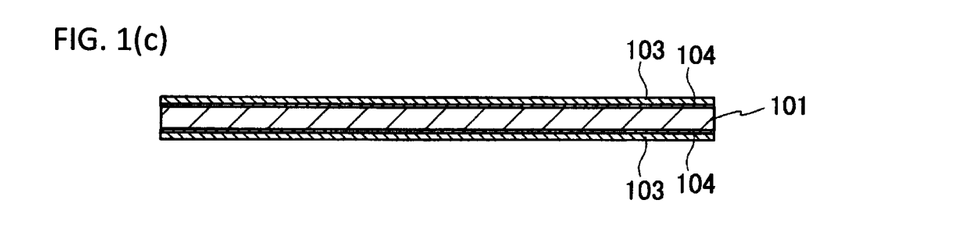
Figure 1D:
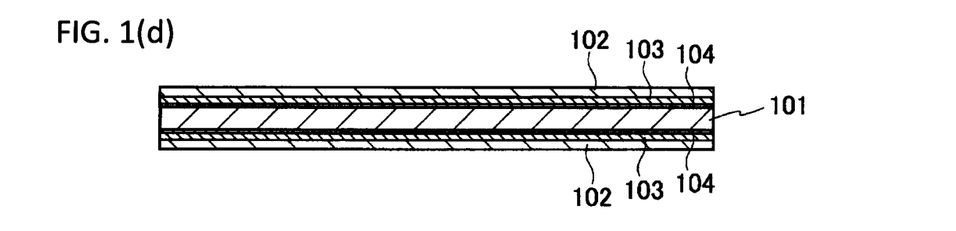
Figure 2A:
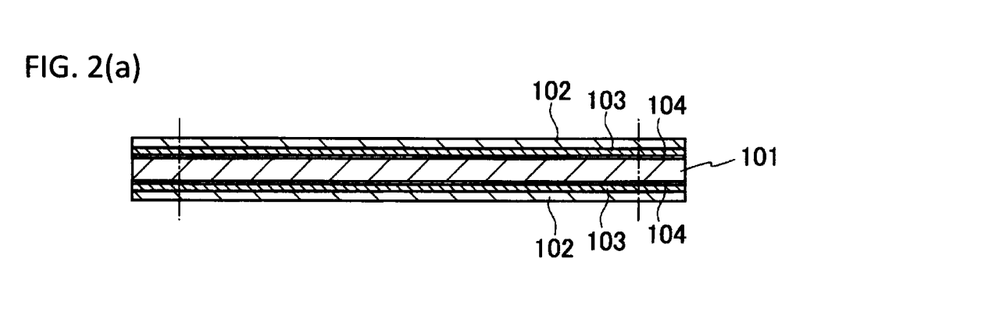
FIGS. 2(a) to 2(c) are views showing the method of manufacturing the related coreless board.
Figure 2B:
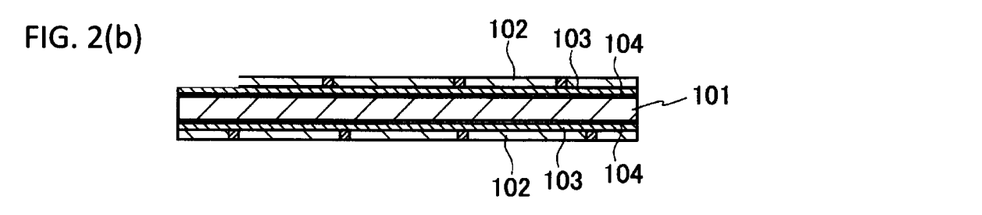
Figure 2C:
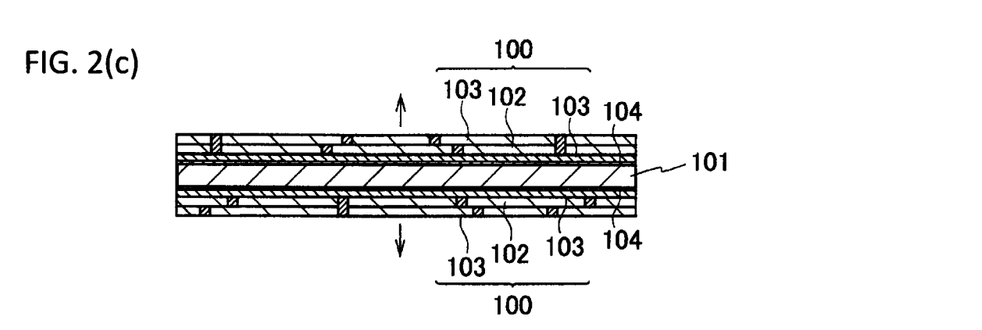
Figure 3A:
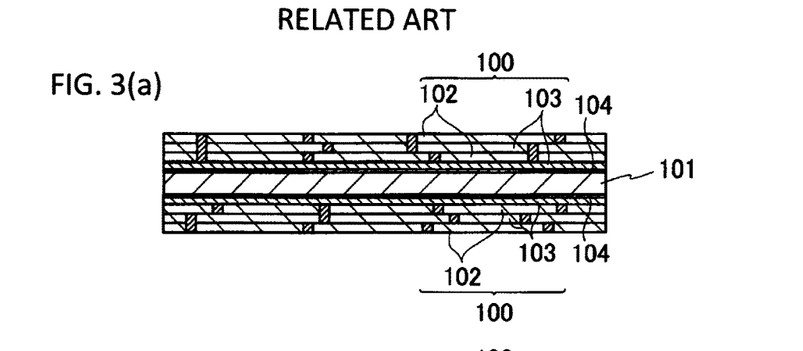
FIGS. 3(a) to 3(d) are views showing the method of manufacturing the related coreless board.
Figure 3B:
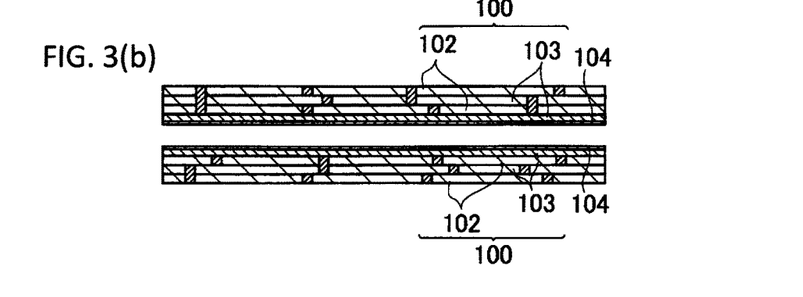
Figure 3C:
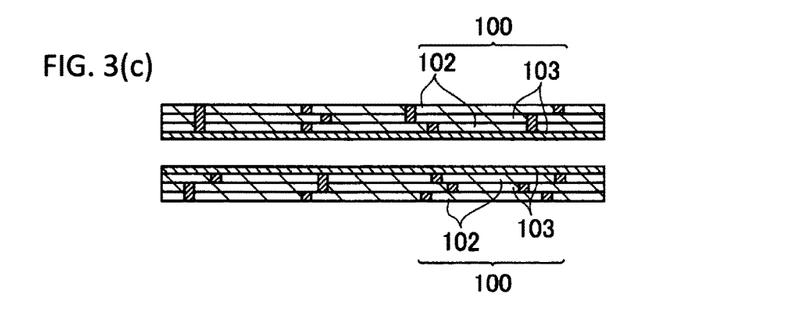
Figure 3D:
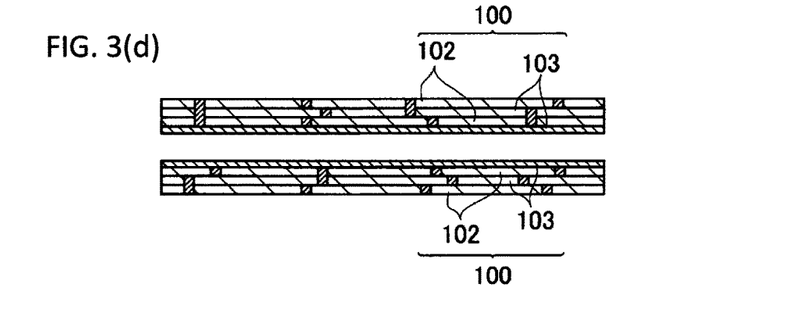
Figure 4A:
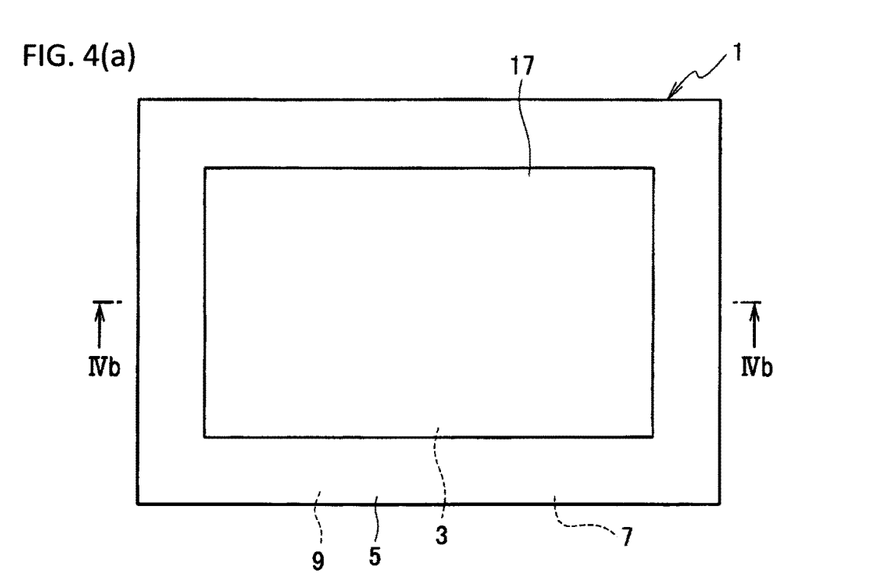
FIG. 4(a) is a plan view of the configuration.
Figure 4B:
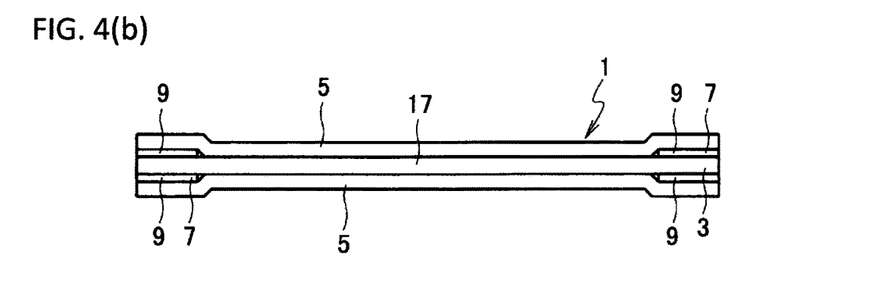
FIG. 4(b) is a cross-sectional view of the configuration taken along the IVb-IVb in FIG. 4(a)
Figure 4C:
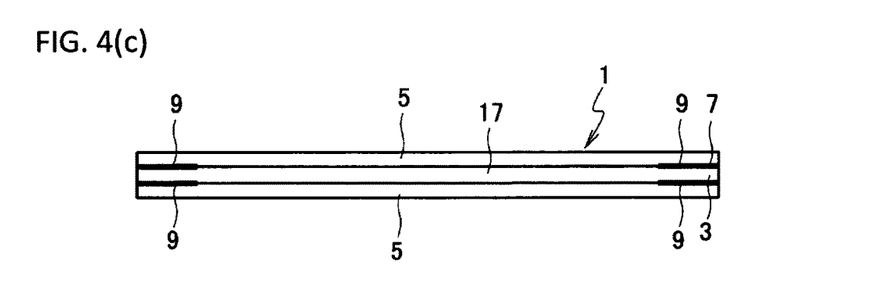
FIG. 4(c) is a simplified view of the configuration in FIG. 4(b).
Figure 6A:
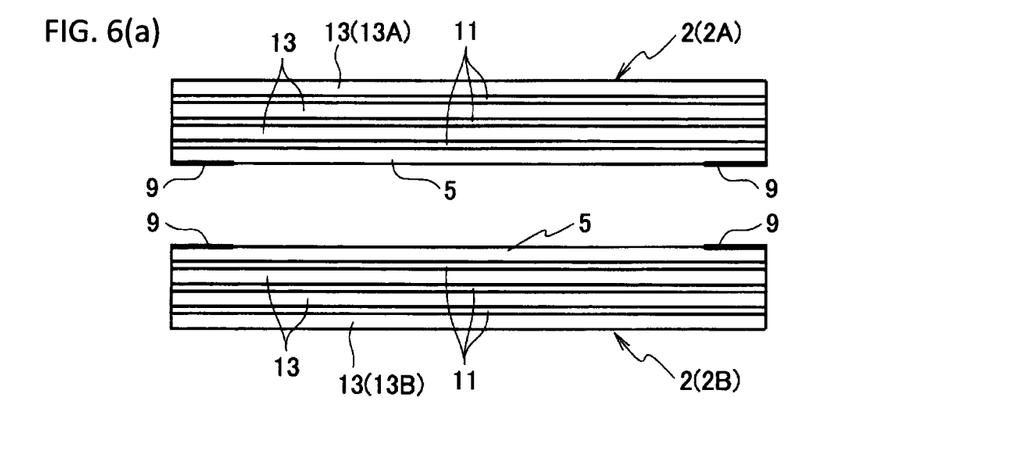
FIGS. 6(a) and 6(b) are views showing the method of manufacturing the carrier-attached metal foil and the coreless board.
Figure 6B:
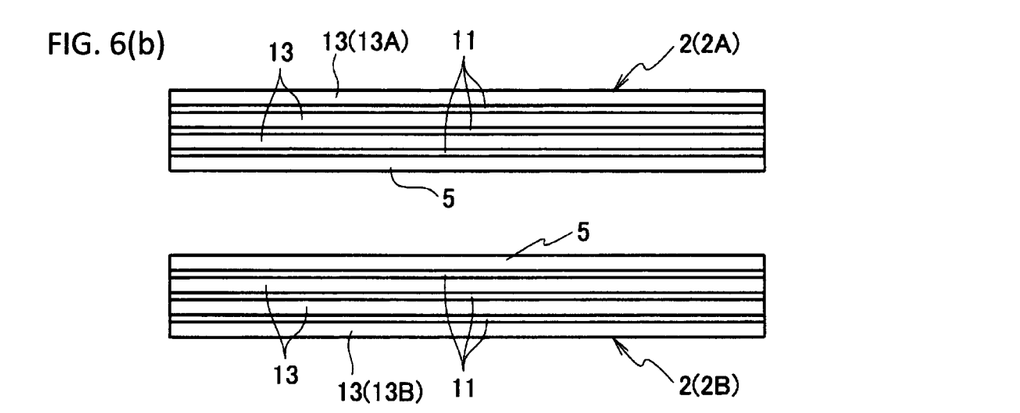

A carrier-attached metal foil 1 according to an embodiment of the present invention is used for manufacturing a laminated board 2 (see FIG. 6(b)) and the like. As shown in FIG. 4, the carrier-attached metal foil 1 includes a carrier 3, metal foils 5, and pressure-sensitive adhesives (pressure-sensitive adhesive materials) 9.

The carrier 3 is made of a prepreg (fibers such as carbon fibers coated with a thermosetting resin), for example, and is formed shaped in a plate (such as a rectangular flat plate) with a thickness in a range from about 0.2 mm to 1 mm and lateral and longitudinal dimensions in a range from about 300 mm to 500 mm each. As the carrier 3, any of metal materials such as an indium plate, and other materials may be employed instead of the prepreg.

Each metal foil 5 is made of a copper foil (or more specifically, an electrolytic copper foil) shaped like a thin flat plate with a thickness in a range from about 2 μm to 50 μm, for example. The metal foil 5 is laminated on at least one of surfaces (one surface in the thickness direction or two surfaces in the thickness direction) of the plate-shaped carrier 3. As the metal foil 5, any of foils made of aluminum, nickel, zinc, and the like may be employed instead of the copper foil.

A pressure-sensitive adhesive (such as a weak pressure-sensitive adhesive) 9 is provided between the carrier 3 and each corresponding metal foil 5 and at peripheries 7 of the carrier 3 and the metal foil 5. Then, the carrier 3 and the metal foils 5 are integrated together with the assistance of the pressure-sensitive adhesives 9. Each pressure-sensitive adhesive 9 is formed into a thin layer with a thickness of about 1 μm to 50 μm.

To be further in detail, the pressure-sensitive adhesive 9 is made of a mixture of polyvinyl alcohol (hereinafter referred to as "PVA") and silicone. Specifically, the pressure-sensitive adhesive 9 is prepared by mixing PVA aqueous solution with silicone resin.

The pressure-sensitive adhesive 9 thus prepared can change its pressure-sensitive adhesion strength by modifying the mixture ratio between PVA and silicon resin. Water solubility of the pressure-sensitive adhesive 9 is enhanced by increasing the proportion of PVA.

In the embodiment, the proportion of silicone resin to be mixed in the pressure-sensitive adhesive 9 is set in a range from 10% to 60% in terms of the ratio by weight so as to obtain fine solubility and adhesion.

Here, the fine adhesion means that peel strength between the pressure-sensitive adhesive 9 and the carrier 3 has a value in a range from 5 g/cm (0.049 N/cm) to 500 g/cm (4.9 N/cm). The fine solubility means that a layer of the pressure-sensitive adhesive 9 with a thickness of 10 µm dissolves within 30 seconds when the layer is dipped and immersed in purified water at 20° C.

When the carrier-attached metal foil 1 is viewed in the thickness direction, the shape of the carrier 3 and the shape of each meal foil 5 coincide with each other, for example. In the carrier-attached metal foil 1, the thickness direction of the carrier 3, the thickness direction of the pressure-sensitive adhesive 9, and the thickness direction of the metal foil 5 coincide with one another. When the carrier-attached metal foil 1 is viewed in the thickness direction, the entire carrier 3 overlaps the entire metal foils 5 (see FIG. 4(a)).

The pressure-sensitive adhesives 9 are formed only at the peripheries of the carrier 3 and the metal foils 5. Accordingly, when the carrier-attached metal foil 1 is viewed in the thickness direction, each pressure-sensitive adhesive 9 (the periphery 7) is formed into a rectangular frame shape which is a shape formed, for example, by bending a strip-shaped object with a predetermined width appropriately at intermediate portions (at three positions) in a longitudinal direction thereof each at a right angle, and then connecting its two end portions in the longitudinal direction to each other. An outline of the pressure-sensitive adhesive 9 coincides with the outlines of the carrier 3 and the metal foil 5.

In an aspect where the metal foil 5 is provided only on one of the surfaces in the thickness direction of the carrier 3 by using the pressure-sensitive adhesive 9, the carrier 3, the pressure-sensitive adhesive 9, and the metal foil 5 overlap one another in this order at the peripheries 7 where the pressure-sensitive adhesive 9 is provided. At a place on a central part where no pressure-sensitive adhesives 9 are provided (a location other than the peripheries 7; a central region 17), the carrier 3 and the metal foil 5 overlap each other in this order.

As shown in FIG. 4(b), in an aspect where the metal foils 5 are provided on the two surfaces in the thickness direction of the carrier 3 by using the pressure-sensitive adhesives 9, the metal foil 5, the pressure-sensitive adhesive 9, the carrier 3, the pressure-sensitive adhesive 9, and the metal foil 5 overlap one another in this order at the peripheries 7 where the pressure-sensitive adhesives 9 are provided. At the place on the central part where no pressure-sensitive adhesives 9 are provided (the central region 17), the metal foil 5, the carrier 3, and the metal foil 5 overlap one another in this order.

Another acceptable aspect may be employed where: each metal foil 5 is formed smaller than the carrier 3 when viewed in the thickness direction of the metal foil 5; and the metal foil 5 is located on inside of the carrier 3.

Figure 5A:
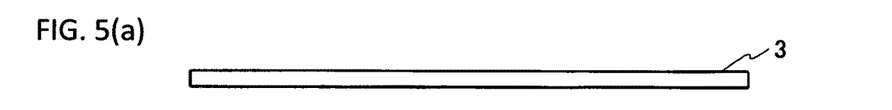
FIGS. 5(a) to 5(e) are views showing a method of manufacturing a carrier-attached metal foil and a coreless board.
Figure 5B:
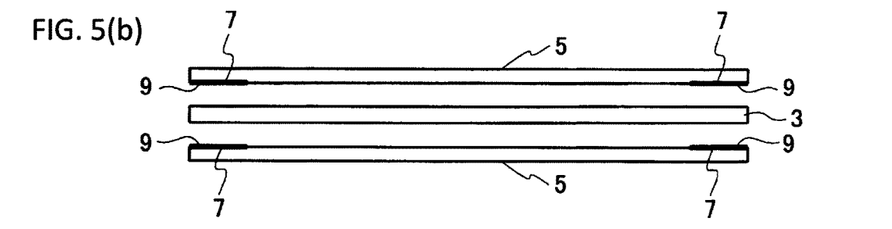
Figure 5C:
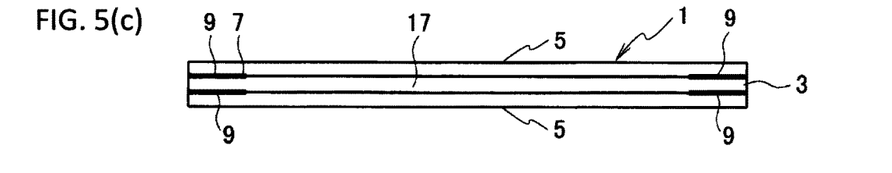
Figure 5D:
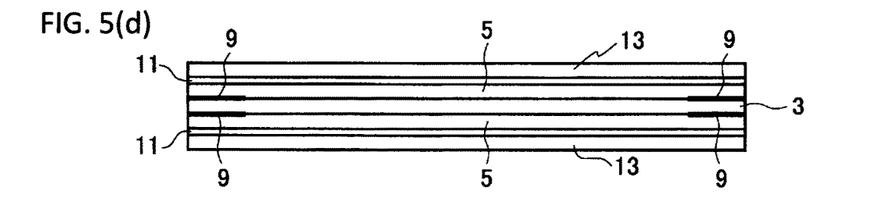
Figure 5E:
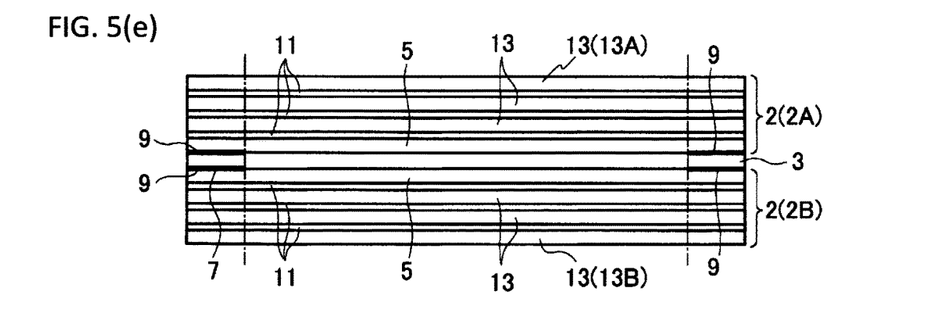

Since the thickness of each pressure-sensitive adhesive 9 is extremely small, the surface of the metal foil 5 is almost flat as illustrated in FIG. 4(c), FIG. 5, and FIG. 6. In FIG. 4(c), FIG. 5, and FIG. 6, the pressure-sensitive adhesives 9 are each illustrated with a heavy line.

If a difference in expansion or contraction between the carrier 3 and the metal foil 5 occurs due to a change in temperature, the pressure-sensitive adhesive 9 is designed to flow in accordance with the difference in expansion or contraction. Moreover, the pressure-sensitive adhesive 9 is designed to keep holding the carrier 3 and the metal foil 5 while relaxing internal stresses thereof.

The above-mentioned change in temperature is likely to take place either when the temperature of the carrier-attached metal foil 1 is raised by applying heat and pressure to the carrier-attached metal foil 1 in order to cure (completely cure) epoxy resin (a thermosetting resin) inside the carrier 3 (to make the resin C-staged; to bring the resin in a C-stage range), the epoxy resin being in an intermediately cured state (a semi-cured state) (being B-staged; being in a B-stage range) at room temperature, or when the temperature thereof returns to room temperature again.

Here, the pressure-sensitive adhesive 9 will be described further.

Among various pressure-sensitive adhesives, the pressure-sensitive adhesive 9 is of a type with a weak pressure-sensitive adhesive force. A pressure-sensitive adhesive is a semisolid substance with high viscosity and low elasticity from the beginning (a high-viscosity liquid or a gel-like solid), which does not change its state after establishing a bonded state. In other words, the pressure-sensitive adhesive does not require a solidifying process. According to JIS (Japanese Industrial Standards), pressure-sensitive adhesion is "a sort of adhesion, which is characterized by adhesion established only by applying small pressure for a short time at room temperature without using water, a solvent, heat, and the like." Therefore, the pressure-sensitive adhesive 9, which attaches the carrier 3 and the metal foil 5 together, exerts a practical adhesive force (an attaching force; a pressure-sensitive adhesive force) immediately at the time of attaching them together. The pressure-sensitive adhesive allows the items which have once been attached together to be peeled off from each other.

When the carrier-attached metal foil 1 is at room temperature, no shearing force occurs in the pressure-sensitive adhesive 9 establishing pressure-sensitive adhesion and bonding of the carrier 3 to the metal foil 5 between the carrier 3 and the metal foil 5. When the carrier-attached metal foil 1 (see FIG. 4(b) or FIG. 4(c)) is heated so as to completely cure the carrier 3, the temperature of the carrier 3, the metal foil 5, and the pressure-sensitive adhesive 9 rises to about 200° C. Then, a dimension of the metal foil 5 (a dimension in the left-right direction in FIG. 4(c)) becomes slightly greater than a dimension of the carrier 3 (a dimension in the left-right direction in FIG. 4(c)) due to a difference in the coefficient of thermal expansion.

Even when the temperature of the carrier-attached metal foil 1 rises as described above, the pressure-sensitive adhesive 9 keeps exerting the pressure-sensitive adhesive force without being cured. Nevertheless, when the dimension of the metal foil 5 becomes slightly greater than the dimension of the carrier 3 due to the difference in the coefficient of thermal expansion, a shearing force occurs temporarily in the pressure-sensitive adhesive 9 due to heat stresses of the carrier 3 and the metal foil 5. However, the pressure-sensitive adhesive 9 that maintains the state of the high-viscosity liquid and the like without being cured slowly starts flowing by the shearing force, whereby the shearing force in the pressure-sensitive adhesive 9 gradually decreases, and eventually diminishes or disappears in accordance with the flowing.

Thus, it is possible to either relax or eliminate the internal stresses (the heat stresses) of the carrier 3 and the metal foil 5 even when the carrier-attached meal foil 1 is heated in order to completely cure the carrier 3.

A similar shearing force occurs in the pressure-sensitive adhesive 9 when cooling the heated carrier-attached metal foil 1 back to room temperature again. However, it is possible to either relax or eliminate the internal stresses (the heat stresses) of the carrier 3 and the metal foil 5 as in the heating case.

Here, a method of manufacturing the carrier-attached metal foil 1 and a method of manufacturing the laminated board 2 will be described. In the following descriptions, the laminated boards 2 are manufactured using the two surfaces of the carrier-attached metal foil 1. Instead, the laminated board 2 may be manufactured using only one of the surfaces of the carrier-attached metal foil 1.

First, the carrier 3 being in the B-stage range is prepared as shown in FIG. 5(*a*).

Subsequently, the metal foils 5 with their peripheries 7 provided with the pressure-sensitive adhesives 9 (attaching the pressure-sensitive adhesives 9) are prepared as shown in FIG. 5(*b*). Then, the metal foils 5 are attached to the carrier 3 by using the pressure-sensitive adhesives 9 as shown in FIG. 5(*c*) (an attaching step). Instead of or in addition to proving the metal foils 5 with the pressure-sensitive adhesives 9, the pressure-sensitive adhesives 9 may be provided on the carrier 3, thereby attaching the metal foils 5 to the carrier 3.

Thereafter, the carrier 3, the metal foils 5, and the pressure-sensitive adhesives 9 are pressed together and heated as shown in FIG. 5(*c*) (a first pressing and heating step). The pressing operation is achieved by vertically clamping the components shown in FIG. 5(*c*) by use of not-illustrated tools. It is desirable to locate the components shown in FIG. 5(*c*) in a vacuum atmosphere when the pressing and heating operation is conducted. This prevents entry of the air into a gap between the carrier 3 and each metal foil 5, so that each metal foil 5 can achieve favorable surface flatness. The pressing and heating operation turns the carrier 3 from the B-stage into the C-stage.

The pressure-sensitive adhesives 9 are not cured even after the first pressing and heating step. In the region other than the peripheries 7 (the central region 17; the region where the carrier 3 and the metal foils 5 are in direct contact with each other), the carrier 3 and the metal foils 5 stick together to the extent that they are easily separable.

Subsequently, as shown in FIG. 5(*d*), B-staged prepregs 11 are disposed in an overlapping manner on the metal foils 5, and metal foils 13 (metals foils that are similar to the metal foils 5) are further disposed in an overlapping manner on the overlapping prepregs 11 (a prepreg and metal foil disposing step).

Thereafter, the components shown in FIG. 5(*d*) are pressed together and heated (a second pressing and heating step). The pressing operation is achieved by vertically clamping the components shown in FIG. 5(*d*) by use of not-illustrated tools. It is desirable to locate the components shown in FIG. 5(*d*) in a vacuum atmosphere when the pressing and heating operation is conducted. This prevents entry of the air into a gap between each metal foil 5 and the corresponding prepreg 11, and prevents entry of the air into a gap between each prepreg 11 and the corresponding metal foil 13, so that each metal foil 13 can achieve favorable surface flatness. The pressing and heating operation turns the prepregs 11 from the B-stage into the C-stage. Thus, the metal foils 5, the prepregs 11, and the metal foils 13 stick together and are integrated to the extent that they are easily separable. Furthermore, by locating the components shown in FIG. 5(*d*) in the vacuum atmosphere, the metal foils 5, the prepregs 11, and the metal foils 13 stick together more properly without leaving any gaps in between.

Subsequently, the metal foils 13 are subjected to etching and the like, and further to via-hole formation and plating as appropriate, thereby forming circuits on the metal foils 13 (a first circuit forming step). Note that the display of the circuits and the like is omitted in FIGS. 5(*d*), 5(*e*), and the like.

Thereafter, predetermined numbers of the prepregs 11 and the metal foils 13 alternately overlap one another as shown in FIG. 5(*e*) by repeating the cycle of the prepreg and metal foil forming step, the second pressing and heating step, and the first circuit forming step for a predetermined number of times. Hence, the laminated boards 2 with the metal foils 13 provided with the circuits are formed.

In FIG. 5(*e*), four layers of the metal foils (one layer of the metal foil 5 and three layers of the metal foils 13) exist on an upper side of the carrier 3 while interposing three layers of the prepregs 11 respectively therebetween. Likewise, four layers of the metal foils (one layer of the metal foil 5 and three layers of the metal foils 13) exist on a lower side of the carrier 3 while interposing three layers of the prepregs 11 respectively therebetween.

In the upper laminated board 2A illustrated in FIG. 5(*e*), no circuits have been formed yet on the lowermost metal foil 5 and the metal foil 13A existing on the uppermost side. Similarly, in the lower laminated board 2B illustrated in FIG. 5(*e*), no circuits have been formed yet on the uppermost metal foil 5 and the metal foil 13B existing on the lowermost side.

Subsequently, as shown in FIG. 6(*a*), the laminated board 2A and the laminated board 2B are detached and separated (split off) from the carrier 3 (a laminated board separating step).

Thereafter, the pressure-sensitive adhesives 9 are removed as shown in FIG. 6(*b*), and the metal foils 5, 13A, and 13B of the laminated boards 2A and 2B are subjected to etching and the like, and further to via-hole formation and plating as appropriate, thereby forming circuits on the metal foils 5, 13A, and 13B, respectively (a second circuit forming step).

In each laminated board 2 shown in FIG. 5(*e*) and FIG. 6, all of the carrier 3, the metal foil 5, the prepregs 11, and the metal foils 13 are formed into the same shape, so that the entire carrier 3, the entire metal foil 5, the entire prepregs 11, and the entire metal foils 13 overlap one another. However, the laminated board does not always have to be formed in this way.

For example, the components may be gradually reduced in size in such a way that the metal foil 5 present on the lowermost side in the laminated board 2A is the largest while the metal foils 13 located thereon are formed as large as or smaller than the metal foil 5.

In the components shown in FIG. 5(*e*), chain dashed lines indicate section lines. Here, the laminated boards excluding the peripheries 7 (the laminated boards split off from the carrier 3) may be formed by removing portions corresponding to the peripheries 7, and then the circuits may be formed on the metal foils 5, 13A, and 13B of the laminated boards. The chain dashed lines indicated in FIG. 5(*e*) define a shape of a rectangular frame formed by appropriately bending straight lines when the components shown in FIG. 5(*e*) are viewed in the thickness direction.

Here, each periphery 7 will be described further in detail. The periphery 7 is located on the outside of an outline of a product or a half-finished product when viewed in the thickness direction of the carrier-attached metal foil 1 (the thickness direction of the components shown in FIG. 5(*e*)) (or may be aligned with the outline; in the case of the components shown in FIG. 5(e), the outline and the inner perimeter of the periphery 7 are aligned with each other). The outline of the product or the half-finished product is an outline of the laminated board cut off along the chain dashed lines shown in FIG. 5(e), which is the rectangular outline of the laminated board cut off along the section lines in FIG. 5(e) and viewed in the thickness direction thereof.

The laminated board cut off along the chain dashed lines shown in FIG. 5(e) is installed (mounted) as the product on an electric device or the like without being subjected to another cutting process. Otherwise, the laminated board cut off along the chain dashed lines shown in FIG. 5(e) is installed (mounted) as the half-finished product on an electric device, an electronic device, or the like. When the laminated board cut off along the chain dashed lines shown in FIG. 5(e) is mounted as the half-finished product, the laminated board is further segmented into pieces in another process, and such a segmented piece is installed (mounted) as the product on the electric device, the electronic device, or the like.

A release agent (such as a material prepared by mixing PVA with silicone resin at a rate of 50% relative to PVA) may be applied in a thickness of 1 μm onto one surface (an S surface; a shiny surface; the surface facing the carrier 3) of the copper foil 5. This makes it possible to separate the laminated board 2 from the carrier 3 easily. As shown in FIG. 6(a), when each laminated board 2 is detached from the carrier 3, it is possible to leave most of the pressure-sensitive adhesive 9 on the carrier 3 and to minimize the amount of the pressure-sensitive adhesive 9 that remains attached to the copper foil 5 of the laminated board 2.

The cutting operation along the chain dashed lines shown in FIG. 5(e) may be performed after the completion of the circuit formation on the metal foils 13A and 13B. In this case, the circuit formation on the metal foils 5 is performed after the cutting operation along the chain dashed lines shown in FIG. 5(e).

The cutting operation will be described further with reference to FIG. 7.

The carrier-attached metal foil 1 is usually cut off along lines located outside of edges of the central region 17 (the portion where no pressure-sensitive adhesives 9 exist) and formed into the product or the half-finished product, or cut off along outlines of the central region 17 and formed into the product or the half-finished product. Here, the area (the effective area) of the central region 17 is intentionally defined larger (wider), and the carrier-attached metal foil 1 is cut off along chain dashed lines (section lines) shown in FIG. 7(a) (located inside of inner side lines of the pressure-sensitive adhesive 9 (a fixing unit), i.e., the inside of the pressure-sensitive adhesive 9), and a portion located outside thereof is discarded. Thus, the carrier-attached metal foil 1 is formed into the product or the half-finished product having the smaller (narrower) area than the effective area of the central region 17.

When the carrier-attached metal foil 1 is cut off as described above, the pressure-sensitive adhesive 9 exists between the carrier 3 and the metal foil 5 before the carrier-attached metal foil 1 is cut off. Accordingly, it is possible to prevent various chemicals from leaking in the gap between the carrier 3 and the metal foil 5 during the manufacturing process, and thereby to eliminate adverse effects on the carrier-attached metal foil 1 during the manufacturing process.

Figure 7A:
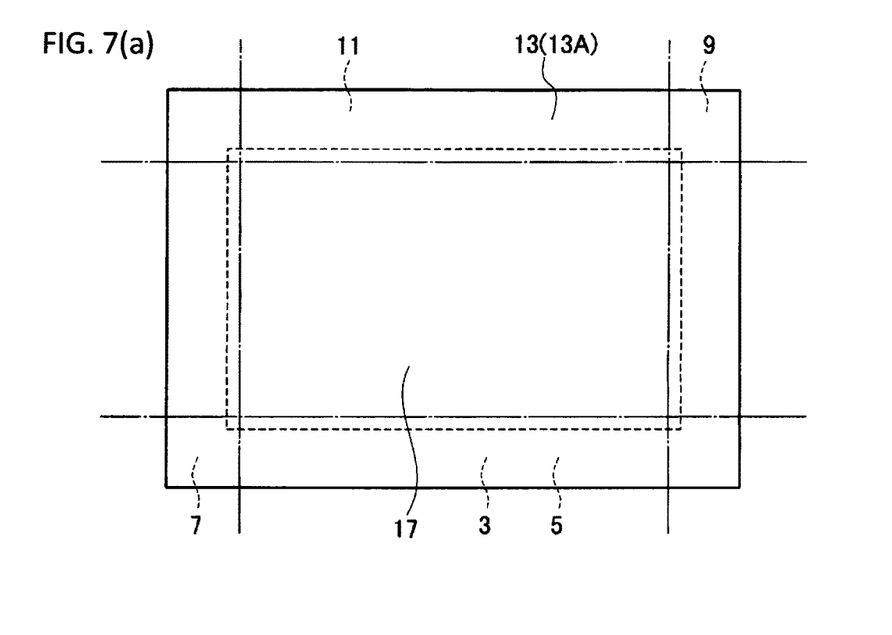
FIG. 7(a) is a plan view for explaining section lines.
Figure 7B:
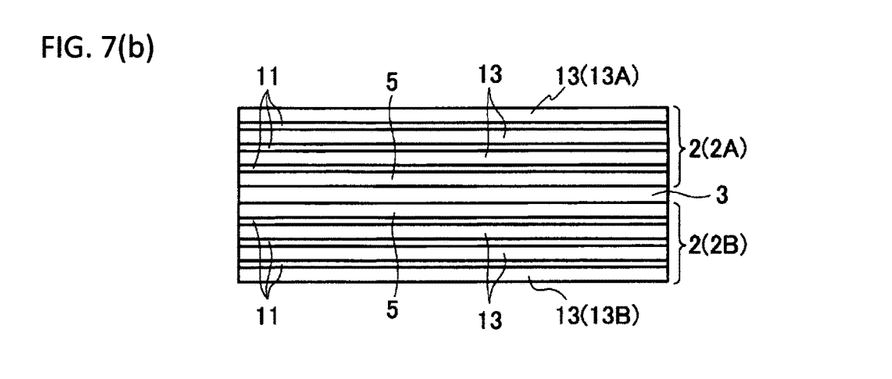
FIG. 7(b) is a side view of the carrier-attached metal foil cut off along the section lines in FIG. 7(a).

Moreover, a side view of the carrier-attached metal foil 1 cut off along the chain dashed lines (the section lines) shown in FIG. 7(a) exhibits a state shown in FIG. 7(b). Specifically, the pressure-sensitive adhesive 9 does not exist between the carrier 3 and each metal foil 5. Hence, an excessive force is not applied to the laminated boards 2A and 2B when the laminated boards 2A and 2B are peeled off the carrier 3. Accordingly, the flat laminated boards 2A and 2B can be obtained by smoothly peeling the laminated boards 2A and 2B off the carrier 3.

When the laminated boards 2A and 2B are peeled off the carrier 3, if the pressure-sensitive adhesive 9 exists between the carrier 3 and each metal foil 5, then an excessive force is applied to the laminated boards 2A and 2B and the laminated boards 2A and 2B are curled. As a consequence, it is not possible to obtain the flat laminated boards 2A and 2B.

Meanwhile, if the pressure-sensitive adhesive force of the pressure-sensitive adhesive 9 is reduced in order to avoid the curling of the laminated boards 2A and 2B, various chemicals leak in the gap between the carrier 3 and each metal foil 5 during the manufacturing process, thereby adversely affecting the carrier-attached metal foil 1 during the manufacturing process.

In the carrier-attached metal foil 1, the pressure-sensitive adhesives 9 are provided only at the peripheries 7 of the carrier 3 and the metal foils 5. As a consequence, when the laminated boards 2 are peeled off the carrier 3 after the formation of the laminated boards 2, it is possible to peel the laminated boards 2 off more easily than a conventional case (a case of attachment to the entire surface). Hence, operability is improved when manufacturing the laminated boards 2.

In the carrier-attached metal foil 1, when the pressure-sensitive adhesives 9 are formed from the mixture of PVA and silicone resin, a more-than-necessary amount of pressure-sensitive adhesives 9 can be easily removed by water rinsing or acid rinsing in the manufacturing work for the laminated boards 2. Specifically, although the pressure-sensitive adhesives 9 remain on the surfaces of the laminated boards 2 after the separation of the laminated boards 2, the pressure-sensitive adhesives 9 can be easily removed by water rinsing or acid rinsing prior to the formation of the circuits on the laminated boards 2 since the pressure-sensitive adhesives 9 are water-soluble.

Furthermore, in the carrier-attached metal foil 1, the pressure-sensitive adhesives 9 are provided only at the peripheries 7. As a consequence, the amount of the pressure-sensitive adhesives 9 to be is less than that in the conventional case so that the pressure-sensitive adhesives 9 can be removed more easily.

Hence, it is possible to provide the carrier-attached metal foil 1 which can improve operability in manufacturing the laminated boards 2.

Since the pressure-sensitive adhesives 9 are provided at the peripheries 7 of the carrier 3 and the metal foils 5, the chemical solution used at the time of etching or plating can be prevented from leaking in the gap between each copper foil 5 and the carrier 3. Accordingly, it is possible to prevent the detachment of the metal foils 5 from the carrier 3.

In the carrier-attached metal foil 1, if a difference in expansion or contraction between the carrier 3 and the metal foil 5 occurs due to a change in temperature, the pressure-sensitive adhesive 9 flows in accordance with the difference in expansion or contraction, and keeps holding the carrier 3 and the metal foil 5 while relaxing the internal stresses thereof. Accordingly, it is possible to achieve favorable surface flatness of the laminated board 2 after the detachment of the laminated board 2 from the carrier 3, to prevent the occurrence of wrinkles or warpage as much as possible on the laminated board 2, and thus to improve yield.

In addition, as a result of the cutting off on the inside of the pressure-sensitive adhesives 9 that fix the carrier 3 and the metal foils 5, the laminated boards 2A and 2B can be smoothly peeled off the carrier 3. Thus, the flat laminated boards 2A and 2B can be obtained.

Figure 8:
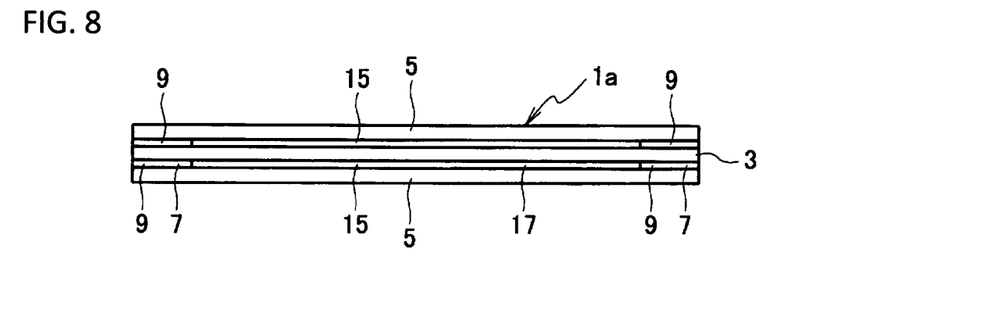
FIG. 8 is a view showing a schematic configuration of a carrier-attached metal foil according to a modified example, which is a view corresponding to FIG. 4(b).

Now, a carrier-attached metal foil 1a according to a modified example will be described with reference to FIG. 8.

The carrier-attached metal foil 1a of the modified example is different from the carrier-attached metal foil 1 in that void fillers 15 are provided in the central region 17 (the region other than the peripheries 7). For the rest, the carrier-attached metal foil 1a is formed and used almost in the same manner as the carrier-attached metal foil 1, and brings about almost similar effects to those of the carrier-attached metal foil 1.

Specifically, the carrier-attached metal foil 1a of the modified example is provided with the void fillers 15. Each void filler 15 is formed shaped in a plate with a thickness almost equal to the thickness of the pressure-sensitive adhesive 9. The void filler 15 is provided between the carrier 3 and each metal foil 5 and at the location (the central region 17) excluding the location (the peripheries 7) where the pressure-sensitive adhesive 9 is provided. The void filler 15 is formed from a material such as a resin (more specifically, a prepreg similar to the carrier 3). The void filler 15 is either simply disposed without being pressure-sensitively attached to or attached to the carrier 3 or the metal foil 5, or pressure-sensitively attached to or attached to the carrier 3 and/or the metal foil 5 with a very small force.

In the carrier-attached metal foil 1a, the plate-shaped void fillers 15 are provided at the locations (the central region 17) excluding the peripheries 7 where the pressure-sensitive adhesives 9 are provided. Thus, the thickness of the carrier-attached metal foil 1a becomes more uniform. In other words, the flatness of the two surfaces in the thickness direction of the carrier-attached metal foil 1a is even more favorable. As a consequence, the laminated boards 2 in more accurate shapes can be manufactured easily.

Figure 9:
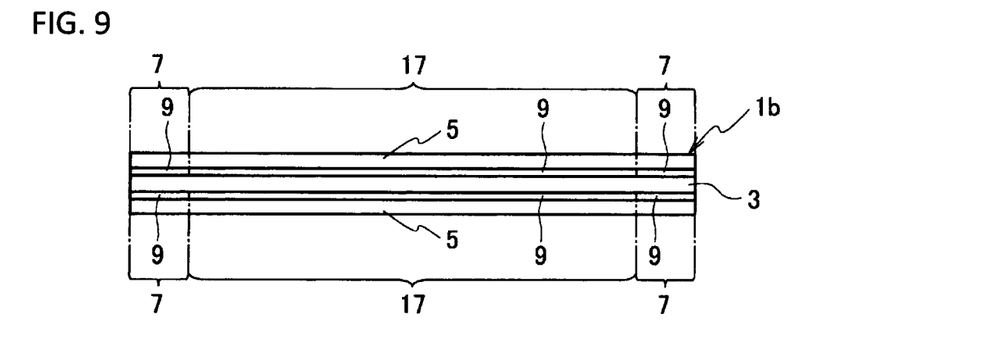
FIG. 9 is a view showing a schematic configuration of a carrier-attached metal foil according to another modified example, which is a view corresponding to FIG. 4(b).

Next, a carrier-attached metal foil 1b according to another modified example will be described with reference to FIG. 9.

The carrier-attached metal foil 1b of the other modified example is different from the carrier-attached metal foil 1 in that, although the pressure-sensitive adhesives 9 are provided on the entire surfaces of the carrier 3 and the entire surfaces of the metal foils 5, the pressure-sensitive adhesives 9 exert the pressure-sensitive adhesion to the carrier 3 and the metal foils 5 only at the peripheries 7. For the rest, the carrier-attached metal foil 1b is formed and used almost in the same manner as the carrier-attached metal foil 1, and brings about almost similar effects to those of the carrier-attached metal foil 1.

Specifically, the carrier-attached metal foil 1b of the modified example includes: the plate-shaped carrier 3; the metal foil 5 laminated on at least one of surfaces of the plate-shaped carrier 3; and the pressure-sensitive adhesive 9 provided between the carrier 3 and the metal foil 5 and on the entire surfaces of the carrier 3 and the metal foils 5.

Moreover, in the carrier-attached metal foil 1b of the modified example, the pressure-sensitive adhesive 9 is active at the periphery 7 of the plate-shaped carrier 3, but the pressure-sensitive adhesive 9 is not active at the central region 17 other than the periphery 7 of the plate-shaped carrier 3 (for example, the pressure-sensitive adhesive 9 hardly exerts the pressure-sensitive adhesive force or barely exerts an extremely small pressure-sensitive adhesive force as compared to the pressure-sensitive adhesive force at the periphery 7, whereby the pressure-sensitive adhesive 9 can be peeled off very easily).

In the central region 17, the pressure-sensitive adhesive 9 is designed not to exert adhesion to either the carrier 3 or the metal foil 5. Instead, the pressure-sensitive adhesive 9 may be designed not to exert adhesion to at least one of the carrier 3 and the metal foil 5.

In order to avoid exertion of adhesion, a surface of the central region 17 of the carrier 3 and a surface of the central region 17 of the metal foil 5 are subjected to a non-stick surface treatment such as fluororesin coating.

In the carrier-attached metal foil 1b, the pressure-sensitive adhesives 9 are not active in the central region 17 other than the periphery 7 of the carrier 3. Hence, as in the case of the carrier-attached metal foil 1, when the laminated boards 2 are peeled off the carrier 3 after the formation of the laminated boards 2, it is possible to peel the laminated boards 2 off more easily than in the conventional case, and operability is improved when manufacturing the laminated boards 2.

In the carrier-attached metal foil 1b, the pressure-sensitive adhesives 9 are provided on the entire surfaces of the carrier 3 and the metal foils 5. Thus, the thickness of the carrier-attached metal foil 1b becomes more uniform. In other words, the flatness of the two surfaces in the thickness direction of the carrier-attached metal foil 1b is even more favorable. As a consequence, the laminated boards 2 in more accurate shapes can be manufactured easily.

In the carrier-attached metal foil 1b of the modified example, Instead of or in addition to subjecting the surfaces of the central regions 17 of the carrier 3 and the metal foils 5 to the non-stick surface treatment such as fluororesin coating, fine asperities (fine asperities for allowing pressure-sensitive adhesion of the pressure-sensitive adhesive 9) may be formed in advance at the periphery 7 of the plate-shaped carrier 3 (or matte finish may be performed at the periphery 7), while the central region 17 of the plate-shaped carrier 3 may be formed into a mirror surface (a surface having the same degree of surface roughness as that of a mirror used in a cheval glass, a glass stand, or the like), so that the pressure-sensitive adhesive 9 can exert the adhesive force only at the periphery 7. In this case, the metal foil 5 is formed into a mirror surface, and the pressure-sensitive adhesive 9 exerts a smaller pressure-sensitive adhesive force to the metal foil 5 than to the periphery 7 of the carrier 3.

Instead of or in addition to forming the fine asperities in advance at the periphery 7 of the carrier 3, fine asperities may be formed in advance at the periphery 7 of the metal foil 5.

Figure 10:
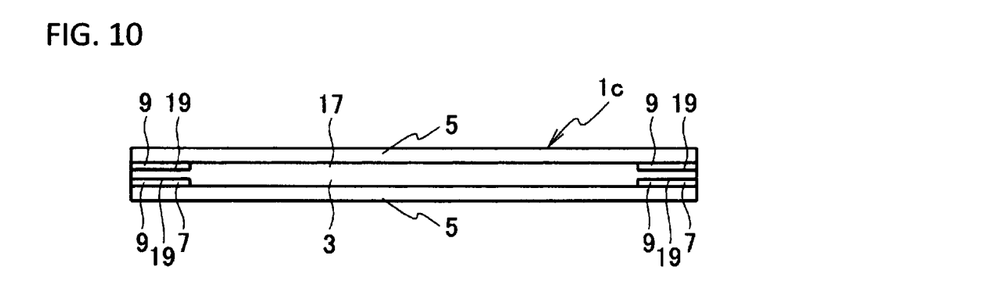
FIG. 10 is a view showing a schematic configuration of a carrier-attached metal foil according to still another modified example, which is a view corresponding to FIG. 4(b).

Next, a carrier-attached metal foil 1c according to still another modified example will be described with reference to FIG. 10.

The carrier-attached metal foil 1c according to still the other modified example is different from the carrier-attached metal foil 1 in that recesses 19 are provided at the periphery 7 of the carrier 3. For the rest, the carrier-attached metal foil 1c is formed and used almost in the same manner as the carrier-attached metal foil 1, and brings about almost similar effects to those of the carrier-attached metal foil 1.

Specifically, in the carrier-attached metal foil 1c of the still other modified example, the recesses 19 are provided at regions (the periphery 7) of the carrier 3 where the pressure-sensitive adhesives 9 are provided. At the periphery 7, each recess 19 reduces the thickness of the carrier 3 by the thickness of the thickness of each pressure-sensitive adhesive 9.

In the carrier-attached metal foil 1c, the recesses 19 are provided in the regions of the carrier 3 where the pressure-sensitive adhesives 9 are provided, whereby the thickness of the carrier 3 is reduced by the thickness of each pressure-sensitive adhesive 9. Thus, the thickness of the carrier-attached metal foil 1c becomes more uniform. In other words, the flatness of the two surfaces in the thickness direction of the carrier-attached metal foil 1c is even more favorable. As a consequence, the laminated boards 2 in more accurate shapes can be manufactured easily.

The above-described carrier-attached metal foil 1c is an example of the carrier-attached metal foil including: the plate-shaped carrier; the metal foil laminated on at least one of surfaces of the plate-shaped carrier; and the fixing unit (a fixing material) which fixes the periphery of the carrier and the periphery of the metal foil to each other.

In the carrier-attached metal foil 1c, only the periphery of the metal foil and only the periphery of the carrier are fixed to each other by the fixing unit. Here, it is not always necessary to fix the entire peripheries, and a configuration to fix only part of the peripheries is also acceptable. For example, it is desirable that the metal foil and the carrier be fixed to each other at least in the vicinity of each of corner portions of the metal foil and the carrier.

While the above-described pressure-sensitive adhesive 9 can of course be used as the fixing unit, it is also possible to use a grommets, a separate clip (in an aspect of clamping the carrier and the metal foil with the clip), a hook-and-loop fastener, an adhesive, a structure in which part of the carrier is thermally fused and attached to the metal foil, and so forth instead of the pressure-sensitive adhesive.

A configuration simultaneously employing two or more types among the pressure-sensitive adhesive, the grommet, the separate clip, the hook-and-loop fastener, the adhesive, the structure in which part of the carrier is thermally fused and attached to the metal foil described above is also applicable.

Although the present invention has been described with reference to the embodiment, the present invention is not limited to the above, and configurations of any of the components can be replaced with other arbitrary configurations having similar functions.

The entire contents of Japanese Patent Applications No. 2012-048847 (filing date: Mar. 6, 2012) and No. 2012-185397 (filing date: Aug. 24, 2012) are incorporated herein.

The invention claimed is:

1. A carrier-attached metal foil comprising:
an entirely flat plate-shaped carrier;
an entirely flat metal foil laminated on at least one of surfaces of the carrier; and
a pressure-sensitive adhesive provided at least between the carrier and the metal foil and at a periphery of the carrier surrounding a central region of the carrier and a periphery of the metal foil surrounding a central region of the metal foil, the pressure-sensitive adhesive fixing the periphery of the carrier and the periphery of the metal foil to each other with the pressure-sensitive adhesive in direct contact with both the carrier and the metal foil,
wherein the pressure-sensitive adhesive is not provided in the central region of the carrier such that the central region of the carrier and the central region of the metal foil remain in non-adhesive contact to each other, and
wherein the carrier and the metal foil are to be cut off at portions within the central region of the carrier and the central region of the metal foil, and
wherein the periphery of the carrier and the periphery of the metal foil are: cut off from the central region of the carrier and the central region of the metal foil; removed; and not used as a product.

2. The carrier-attached metal foil according to claim 1, wherein upon occurrence of a difference in expansion or contraction between the carrier and the metal foil due to a change in temperature, the pressure-sensitive adhesive flows in accordance with the difference in expansion or contraction and keeps holding the carrier and the metal foil while relaxing internal stresses of the carrier and the metal foil.

3. The carrier-attached metal foil according to claim 1, further comprising: a void filler shaped in a plate with a thickness equal to a thickness of the pressure-sensitive adhesive, and provided between the carrier and the metal foil and at a location other than a location where the pressure-sensitive adhesive is provided.

4. The carrier-attached metal foil according to claim 1, wherein
fine asperities are formed in the periphery of the carrier, and
the central region of the carrier is formed into a mirror surface.

5. The carrier-attached metal foil according to claim 1, further comprising: a recess provided at a region of the carrier where the pressure-sensitive adhesive is provided, the recess being formed by reducing a thickness of the carrier by a thickness of the pressure-sensitive adhesive.

6. The carrier-attached metal foil according to claim 1, wherein the pressure-sensitive adhesive is provided at least between the carrier and the metal foil and around an entire periphery of the carrier surrounding the central region of the carrier and around an entire periphery of the metal foil surrounding the central region of the metal foil.

7. The carrier-attached metal foil according to claim 1, wherein
the metal foil is conductive, and
the metal foil is for formation of electronic circuits.

8. The carrier-attached metal foil according to claim 7, wherein the carrier is rectangular shaped.

9. The carrier-attached metal foil according to claim 1, wherein the plate-shaped carrier is made of a prepreg.

* * * * *